United States Patent
Weiss et al.

(10) Patent No.: US 7,750,637 B2
(45) Date of Patent: Jul. 6, 2010

(54) TRANSMISSION LINE FOR USE IN RF FIELDS

(75) Inventors: Steffen Weiss, Hamburg (DE); Bernhard Gleich, Hamburg (DE); Peter Vernickel, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 368 days.

(21) Appl. No.: 11/571,006

(22) PCT Filed: Jun. 23, 2005

(86) PCT No.: PCT/IB2005/052073
§ 371 (c)(1),
(2), (4) Date: Dec. 20, 2006

(87) PCT Pub. No.: WO2006/003566
PCT Pub. Date: Jan. 12, 2006

(65) Prior Publication Data
US 2008/0278168 A1 Nov. 13, 2008

(30) Foreign Application Priority Data
Jun. 28, 2004 (EP) .................... 04103003

(51) Int. Cl.
*G01V 3/00* (2006.01)
(52) U.S. Cl. ...................... 324/322; 324/318
(58) Field of Classification Search .......... 324/318, 324/322; 333/26, 33
See application file for complete search history.

(56) References Cited
U.S. PATENT DOCUMENTS

| | | | | |
|---|---|---|---|---|
| 3,729,694 A | * | 4/1973 | Huntington et al. | ........... 333/33 |
| 4,288,759 A | * | 9/1981 | Stover | ........... 333/24 R |
| 4,572,198 A | | 2/1986 | Codrington | |
| 4,621,203 A | * | 11/1986 | Sweeny | ........... 327/528 |
| 5,091,708 A | * | 2/1992 | Bezjak | ........... 333/26 |
| 5,451,914 A | * | 9/1995 | Stengel | ........... 333/25 |

(Continued)

FOREIGN PATENT DOCUMENTS

DE  102 49 239 A1  5/2004

(Continued)

OTHER PUBLICATIONS

Bartels, L. W., et al.; Endovascular Interventional Magnetic Resonance Imaging; 2003; Phys. Med. Biol.; 48; pp. R37-R64.

(Continued)

*Primary Examiner*—Louis M Arana

(57) ABSTRACT

An electrically conductive link (connection lead) or transmission line (13) including at least one transformer (41, 42; 83) for coupling at least two lead segments (51, 52; 81, 82) of the line (13) and for providing safety of the line when guided through a RF field. These lines are especially provided for use with a magnetic resonance (MR) imaging system and for connecting an electrical device (10), especially a catheter or another invasive device for the examination of a human body, to a connection unit (12) such as, for example, a power supply or control unit outside the examination zone (1) without imposing the risk of disturbances and/or destruction of the electrical device and/or the connection unit and of burning a patient (P) by a heating of the line when guided through RF fields.

20 Claims, 12 Drawing Sheets

U.S. PATENT DOCUMENTS

| | | |
|---|---|---|
| 5,552,565 A | 9/1996 | Cartier et al. |
| 6,188,306 B1 | 2/2001 | Wollesen |
| 6,593,744 B2 * | 7/2003 | Burl et al. .................. 324/322 |
| 6,677,754 B2 | 1/2004 | Kestler et al. |
| 2005/0218897 A1 | 10/2005 | Schulz et al. |

FOREIGN PATENT DOCUMENTS

| | | |
|---|---|---|
| WO | 99 19739 A1 | 4/1999 |
| WO | 01 22445 A1 | 3/2001 |

OTHER PUBLICATIONS

Kam, D.G., et al.; Enhanced Immunity Against Crosstalk and EMI Using GHz Twisted Differential Line Structure on PCB; 2002; IEEE Symposium Electromagnetic Compatibility; vol. 2; pp. 643-647.

Thiel, A., et al.; Investigations on Novel Coaxial Transmission Line Structures on MCM-L; 1997; IEEE; pp. 38-43.

Weiss, S., et al.; Transmission Line for Improved RF Safety of Interventional Devices; 2005; MRM; 54:182-189.

* cited by examiner

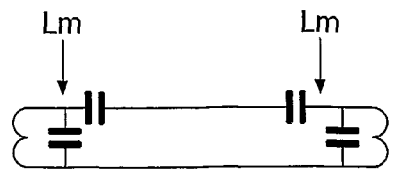
FIG. 24A
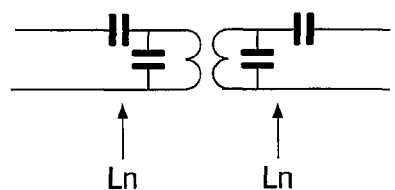
FIG. 24B
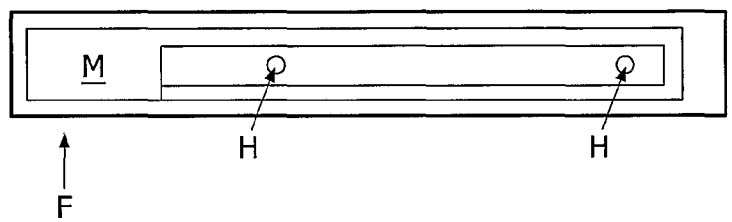
FIG. 25A
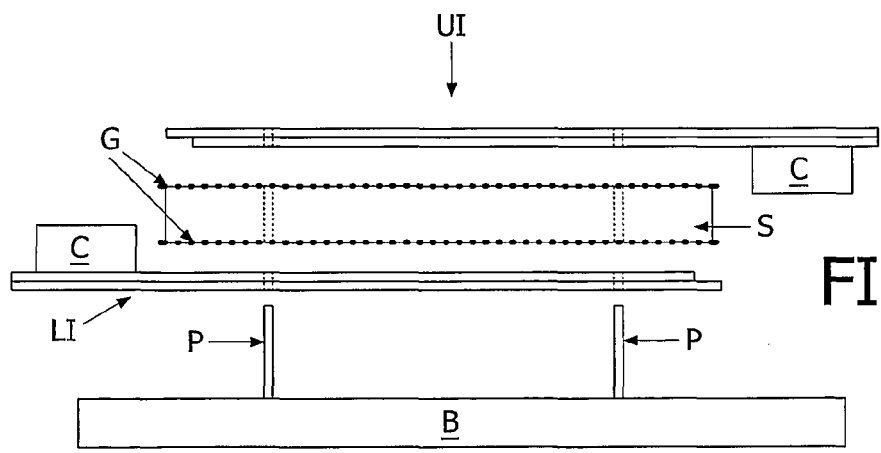
FIG. 25B
FIG. 26

TRANSMISSION LINE FOR USE IN RF FIELDS

The invention relates generally to an electrically conductive link (connection lead) or transmission line comprising at least one transformer for coupling at least two lead segments (sections) of the line and for providing safety of the line when guided through a RF field, as well as an electrical device in combination with such a lead or line. Furthermore, the invention relates to a method for manufacturing such a conductive link (connection lead) or transmission line.

This connection lead or transmission line is especially provided for connecting an electrical device, like for example an accessory device of a magnetic resonance (MR) imaging system, to a connection unit, like for example a power supply or a control unit. However, the connection lead or transmission line can as well be used for connecting implants especially with long conductors or electrodes, like for example heart pacemakers or artificial nerves, for supplying power to preamplifiers, for MR compatible IVUS (intra vascular ultra sound) devices, for multieye tracking of catheters or guide wires during MR image generation, and other applications which require a connection lead or transmission line which is safe when guided through a RF field (for example generated by a MR imaging system).

Furthermore, the invention relates to a connection lead or transmission line in combination with such a device, like especially a catheter or another invasive device for the examination of a human body during MR imaging. The invention relates as well to a MR imaging system comprising one or more electrical accessory devices such as, for example, RF surface coils or catheters with coil elements which are provided with a connection lead or transmission line and which are intended for use during the examination of a patient or another object.

A MR imaging system is used in particular for the examination and treatment of patients. The nuclear spins of the body tissue to be examined are aligned by a steady main magnetic field ($B_0$ field) and are excited by RF pulses ($B_1$ field). The resulting relaxation signals are exposed to gradient magnetic fields for the purpose of localization and are received in order to form in a known manner therefrom a one-, two- or three-dimensional image of the body tissue.

Essentially two types of MR systems can be distinguished. The first one is the so called open MR system (vertical system) in which a patient is introduced into an examination zone which is located between the ends of a C-arm. The patient is accessible during the examination or treatment from practically all sides. The second one is a MR system which comprises a tubular (cylindrical) examination space (axial system) into which the patient is introduced.

RF coil systems are provided for the transmission of the RF signals and the reception of the relaxation signals. In addition to the RF coil systems which are permanently built into the MR imaging apparatus (body coils for imaging substantially the whole body of a patient), use is also made of RF surface coils which can be flexibly arranged, for example, as a sleeve or pad around or in a specific region to be examined.

Furthermore, use is made of catheters or other invasive devices which are introduced into the patient, for example, in order to take a sample of tissue during the MR imaging and which comprise at least one coil element, an oscillator or the like at least at the area of their tip for the purpose of localization in the image formed or for the purpose of imaging.

Connection leads or a transmission lines for connecting accessory devices like these RF surface coils and catheters, as well as other devices as mentioned above, with a connection unit, notably a power supply, a receiving device and/or a control unit, usually have to be guided through RF fields.

Such RF fields, especially the electromagnetic fields generated by the RF coil systems, induce RF common mode signals (currents) in the connection lead or transmission line and in the surrounding body tissue. These currents involve not only the risk of disturbances or destruction of the accessory device and/or the connection unit, but notably can give rise to substantial heating of the lead or line and directly of the adjacent tissue and, especially in the case of surface coils and catheters, to burning of the patient when the leads are too close to or within the patient. Consequently, such leads or lines have to be made safe with respect to these risks.

U.S. Pat. No. 7,205,768 discloses a connection line comprising at least one line section with a length of unequal $n*\lambda/2$ which is limited by an inductive coupling element, especially a transformer. This connection line can be applied to make interventional instruments as intravascular catheters RF-safe for use in MR-guided interventions. However, this prior art does not disclose any method for realization of such a transformer based connection line.

U.S. Pat. No. 6,677,754 discloses a way to suppress these hazards by means of transformers introduced into a coaxial cable. The inner and outer connector at the end of a first section of the coaxial cable are connected by a primary inductor in series with a first capacitor. The inner and outer connector at the end of a second section of the coaxial cable are connected by a secondary inductor in series with a second capacitor. Primary and secondary inductors are coupled to form a transformer. The capacitors are chosen such that the arrangement is resonant at the basic frequency $f_0$ of the RF to be transmitted. Thus, the resonant transformer resembles a tuned blocking filter, that suppresses dangerous common mode resonances that would lead to said heating of the cable. The filter passes the RF signal on the coaxial cable in differential mode.

However, this prior art is restricted to coaxial cable segments or sections connected by transformers. This concept is not suited well for the production of catheters because they must have a small diameter. For standard clinical scanners at 1.5 T at least three transformers are required within standard catheters of about 1.5 m length and even more at higher fields. This means that miniature transformers would have to be connected to matching networks and those to miniature coaxial cables, in all at least twelve connections per catheter. Most likely, the miniature connections would have to be done either manually or semi-automatically with dedicated machinery and tested afterwards. This would imply high cost which is an important factor for disposables. In addition, the connections may be prone to mechanical rupture during mechanical stress during the intervention like tension, bending or torque. Also, the mechanical properties of the cable sections and the transformer sections of the catheter may not be identical which complicates or even prohibits its use in many applications. Finally, the use of coaxial cables as the cable sections between the transformers is not optimal also for electrical reasons.

Therefore it is an object of the invention to provide an electrically conductive link (connection lead) or transmission line as mentioned in the introductory paragraph and a method for manufacturing the same which is safe when guided through a RF field (i.e. with which the risk of disturbances and/or destruction of the electrical device and/or the connection unit is avoided, as well as heating of the line is limited or avoided) and has dimensions and especially a diameter which are small enough for introduction into a human body.

It is another object of the invention to provide an electrically conductive link (connection lead) or transmission line as mentioned in the introductory paragraph and a method for manufacturing the same which is safe in the sense above when guided through a RF field and which can be produced at low cost especially for use with disposable catheters or other invasive devices.

It is another object of the invention to provide an electrically conductive link (connection lead) or transmission line as mentioned in the introductory paragraph and a method for manufacturing the same which is safe in the sense above when guided through a RF field and which has a minimum loss for the signals to be transmitted.

It is as well an object of the invention to provide an electrically conductive link (connection lead) or transmission line as mentioned in the introductory paragraph and a method for manufacturing the same which is safe in the sense above when guided through a RF field and which is suitable with respect to its mechanical properties for invasive applications.

Preferably the matching network comprises discrete elements (C1, C2) which are added to the substrate by SMD techniques.

For example the matching network comprises elements which are provided by a dielectric material with a high dielectric constant which is embedded by thin film techniques into the substrate.

In the electrical accessory device or auxiliary equipment the transmission line (13) is preferably surrounded by a material with low dielectric constant, preferably by air within a lumen (31).

In the method for manufacturing a transmission line according to the invention at least one lead segment of the line and/or at least one transformer is formed of at least one metallic structure on a substrate.

Notably the length of the transmission line is composed by connecting at least two modules which each are formed by at least one lead segment of the line and/or at least one transformer and/or at least one matching network.

For example each two modules are connected by soldering together the modules at a lead segment.

Each two modules are for example connected by glueing together the modules at a transformer.

The transformer is glued together for example by means of a stacking tool comprising alignment pins for combining an upper and a lower end of adjacent modules, between which a spacer is inserted.

Advantageously, the transmission line is inserted into a lumen of the accessory device or auxiliary equipment by pulling it into the lumen by means of a wire like element running through the lumen.

According to a further aspect of the invention, at least one of the following steps is conducted before and/or during the insertion of the transmission line into the lumen: —manufacturing the tube comprising the lumen of the device by materials with low friction properties like e.g. PTFE; stretching the tube comprising the lumen; applying over pressure into the lumen to inflate it; applying a higher pressure at the entry opening of the lumen than at the opposite end of the lumen; applying under-pressure to another lumen of the device and/or to the surroundings of the tube to extend the lumen into which the transmission line is to be inserted.

Further details, features and advantages of the invention will become apparent from the following description of preferred embodiments which is given with reference to the drawings, in which is shown in:

FIG. 1A a diagrammatic side elevation of an MR imaging apparatus and of an accessory device;

FIG. 1B a diagrammatic representation of an accessory device;

FIGS. 2A & 2B cross sections through different types of cables;

FIGS. 3A & 3B cross sections through different catheter tubes;

FIGS. 4A & 4B cross section of a first embodiment of a cable transformer in top view and side view respectively;

FIG. 5 a second embodiment of a cable-transformer;

FIG. 6A-6C several components of a third embodiment of a cable-transformer in side view, top view of the upper layer, and top view of the lower layer respectively;

FIG. 7 the third embodiment of the transformer in complete side view;

FIG. 8 a fourth embodiment of a cable-transformer;

FIGS. 9A & 9B interleaved and side by side arrangements, respectively, of primary and secondary windings for the transformer according to FIG. 8;

FIG. 10A-10C a cross section through different types of striplines: parallel stripline, triplate stripline, and square coaxial stripline respectively;

FIG. 11 another cross section through a more sophisticated stripline;

FIG. 12 impedance plots for various striplines;

FIG. 13 impedance plots for certain types of striplines with various thicknesses;

FIG. 14 impedance plots for other types of striplines with various thicknesses;

FIG. 15 plots of the loss of certain types of striplines with various thicknesses;

FIG. 16 plots of the loss of other types of striplines with various thicknesses;

FIGS. 17A & 17B a first swap of the leads of a stripline;

FIGS. 18A & 18B a second swap of the leads of a stripline;

FIG. 19 a structure of the leads of a stripline;

FIG. 20 a matching network for matching a transformer to a transmission line;

FIG. 21 a plot of the required capacitances for the matching network;

FIGS. 22A & 22B a first stripline with a discrete series capacitor in side view and top view respectively;

FIGS. 23A & 23B a second stripline with a discrete parallel capacitor in side view and top view respectively;

FIGS. 24A & 24B a first and a second PCB line module respectively;

FIGS. 25A & 25B a transformer between two line modules in top view and side view respectively;

FIG. 26 a stacking tool for assembling the transformer and the line modules; and FIG. 27 a distal micro receive coil and a part of a transmission line.

FIG. 1A exemplarily shows components of an open MR imaging apparatus which are of essential importance for the generation and reception of magnetic fields in an examination zone 1. Above and underneath the examination zone 1 there are provided respective magnet systems 2, 3 which generate an essentially uniform main magnetic field ($B_0$ field for magnetizing the object to be examined, that is, for aligning the nuclear spins) whose magnetic flux density (magnetic induction) may be in the order of magnitude of between some tenths of Tesla to some Tesla. The main magnetic field essentially extends through a patient P in a direction perpendicular to the longitudinal axis of the patient (that is, in the x direction).

Planar or at least approximately planar RF conductor structures (resonators) in the form of RF transmission coils 4 ("body coils") are provided for generating RF pulses ($B_1$ field) of the MR frequency whereby the nuclear spins are excited in the tissue to be examined, said RF transmission coils 4 being arranged on the respective magnet systems 2 and/or 3. RF receiving coils 5 are provided for receiving subsequent relaxation events in the tissue; these coils 5 may also be formed by RF conductor structures (resonators) provided on at least one of the magnet systems 2, 3. Alternatively, one common RF resonator can also be used for transmission and reception if it is suitably switched over, or the two RF resonators 4, 5 can serve for the alternating transmission and reception in common.

Furthermore, for the spatial discrimination and resolution of the relaxation signals emanating from the tissue of a patient P (localization of the excited states) there are also provided a plurality of gradient magnetic field coils 7, 8 whereby three gradient magnetic fields are generated which extend in the direction of the x axis. Accordingly, a first gradient magnetic field varies essentially linearly in the direction of the x axis, while a second gradient magnetic field varies essentially linearly in the direction of the y axis, and a third gradient magnetic field varies essentially linearly in the direction of the z axis.

Electrical accessory devices or auxiliary equipments are required for certain examinations. Such devices are, for example, RF surface coils 6 which are used in addition to or as an alternative for the planar RF receiving body coils 5 and which are arranged as RF receiving coils directly on the patient P or the zone to be examined. These RF surface coils 6 are generally constructed as flexible pads or sleeves.

Furthermore, in order to carry out the treatment of the patient P or to extract a tissue sample or to determine tissue parameters, use is often made of a catheter 10 which is introduced into the patient and whose position is to be visualized on a display screen. Various active methods and passive methods (WO 99/19739) as well as global and local detection or tracking strategies are known for this purpose (Bartels and Bakker in "Endovascular interventional magnetic resonance imaging", Institute of Physics Publishing, Phys. Med. Biol. 48 (2003) R37-R64).

FIG. 1B shows a diagrammatic representation of such an accessory device in the form of a catheter 10. On the tip of the catheter (or in a location at a slight distance therefrom) there could be arranged a transmission and/or receiving unit 11, for example, in the form of a microchip on which the necessary components like a coil (and possibly also sensors) are realized, or the tip is provided with sensors or other means according to the prior art. At the end of the catheter 10 which is situated outside the patient P a connection unit 12 is provided in the form of a power supply unit and/or a receiving device and/or a control device and/or a switching unit 41 which is connected, via a conductive link (connection lead) or transmission line 13 which is guided through the catheter, to the transmission and/or receiving unit 11 and via which the transmission and/or receiving unit 11 is activated and possibly the measuring values and data from sensors or other components are transmitted.

In the case of an accessory device in the form of RF surface coils 6, such coils are also connected, via a conductive link (connection lead) or transmission line 13, to a corresponding connection unit 12 (power supply, receiving/transmitting device and/or control device).

As mentioned in the introductory part of the description, the field generated by the RF coil system induces RF common mode currents in the transmission line 13. According to the invention, a safe conductive link (connection lead) or transmission line 13 is provided by introducing miniaturized transformers into the line 13 with minimum loss of signals to be transmitted.

In order to use as few transformers as possible (which itself produce loss and cost), it is preferred to use a transmission line 13 with a dielectric constant $\in_{eff}$ for the common mode as low as possible, because such a line 13 has already the highest resonance frequency for a given length. At the same time the loss of the transmission line 13 should be as low as possible, because the signal received by a micro coil 11 is difficult to be preamplified due to little space available at the tip of a catheter 10.

A comparison between a commercially available micro coaxial cable 20 (Precision Interconnect, AWG 42 D5) having a diameter D of about 333 µm as indicated in cross section in FIG. 2A and a stripline 21 consisting of two parallel leads spaced by a polyamide layer having a width B of about 200 µm and a thickness H of about 160 µm as indicated in FIG. 2B shows that the stripline 21 has a lower profile at the same loss (1.22 dB/m for both cables).

The dielectric constant $\in_{eff}$ for the common mode is mainly determined by the material in the vicinity of the lines. As indicated in FIGS. 3A and 3B, due to the lower profile of the stripline 21 there is more air ($\in$=1) around the stripline 21 after introduction into a secondary lumen 31 of a standard catheter tube 30 with about 1.66 mm outer diameter and a dielectric constant $\in$ of the tubing 32 of between 2 and 4, than in case of a coaxial cable 20. A primary or main lumen 33 (and the surroundings of the catheter) is usually filled with water having a dielectric constant $\in$ of about 81.

Therefore, the dielectric constant $\in_{eff}$ of the stripline 21 is lower than that of the coaxial cable 20. Preferentially, the stripline 21 may be supported by dedicated distance holders to remain in the center of the secondary lumen 31. Vice versa, if the profile of the stripline 21 is increased to that of the coaxial cable 20, the dielectric constant $\in_{eff}$ becomes approximally equal, but then the stripline 21 has a lower loss than the coaxial cable 20.

Moreover, according to FIG. 2B, a stripline (pair line) 21 is effectively wider than thick, i.e. it can be easier fitted to a catheter tube 30 that also has to hold the primary or main lumen 33 as the one above.

A basic idea of the invention is to produce transmission line segments (sections) together with at least one transformer on one common substrate. Multi-layer-laminates of metal and dielectric materials as those used for printed circuit boards (PCB) can be used for this purpose as well. Preferentially, copper is used as metal for its high conductivity. Preferentially, a low dielectric constant Fr and low loss dielectric material as PTFE, PTFE/glass fiber for enhanced mechanical properties is used. Other options are all standard PCB materials. Polyamide has the advantage that it is so heat resistant that the copper layers can be soldered.

Basically, to realize the transmission line sections, microstriplines on a PCB substrate are used. The transformers can be realized as inductively coupling loops at different metal layers of the PCB substrate. Furthermore, the matching networks required to match the transformer to the micro-stripline in terms of characteristic impedance can be realized either by discrete miniature capacitors, e.g. surface mounted devices (SMD) which are placed onto the PCB, by embedded capacitors based on the dielectric layers of the laminate itself, or by embedded capacitors based on materials with high dielectric constant and low loss that are added in thin film technology to the laminate.

The overall PCB design must be optimized for minimal loss across the line. At the same time the common mode resonance should be well above the Larmor frequency of the MR system. This requires a low effective Fr for the common mode of the transmission line as well as a low stray capacity of the transformer. Therefore it is generally proposed to avoid or remove the substrate wherever it is possible and have air instead. For a size requirement given by the dimensions of the catheter, the PCB design tasks can be performed as EM-simulations or by test measurements of individual test parts.

All embodiments which are explained below are designed to fit into a cross section of about 300 μm×600 μm of a secondary lumen 31 of a catheter tube 30 as depicted in FIGS. 3A and 3B. Such a cross section is available as a secondary lumen of a standard 5 F catheter (1.66 mm outer diameter, main lumen 1 mm). However, designs with lower cross sections are possible with the proposed manufacturing techniques as well.

I.) At first, several embodiments of transformers shall be described in more details.

A first embodiment is a transformer comprising in-plane loops according to FIG. 4A in top view and FIG. 4B in side view-cross section. It comprises a first and a second loop 41, 42 with a cross section of about 35×25 μm, a length L of about 5 cm, a lateral distance W of about 500 μm and a horizontal distance H of about 127 μm, that couple inductively. In this embodiment which is based on a PTFE/glass fiber multilayer PCB substrate 40, one loop is made from one layer of copper such that the loops are in-plane with the layer structure of the laminate. The electrical properties are L=64 nH and series resistance R=1.3 Ohm for one loop, coupling coefficient k=0.39. Simulations and measurements of the transmission loss of this transformer matched to a 50 Ohm line revealed $S_{21}$=−1.5 dB. Simulations and tests of the stray capacity of the transformer revealed $C_{stray}$=4 pF.

In order to reduce the loss of this transformer, preferably wider copper leads than 25 μm may be used for the loops, e.g. 50 μm to 100 μm. On the other hand, the thickness of the leads can be reduced to about 17.5 μm, because the skin depth of the MR frequency of 64 MHz (or higher) is about 8.4 μm (or lower). FIG. 5 shows in three dimensions, how the loops 41, 42 are structured from the copper layers 50, 51 of the laminate. Standard vertical through contacts 51a, 52a (vias) are used to connect the layers 51, 52.

One design target for the transformer is to realize a high inductive coupling coefficient between primary and secondary side and at the same time a low stray capacity for the common mode. This can be achieved in a preferred set-up with a primary and secondary loop (winding) with two or more turns each. Then, more copper layers are required. With more turns the length of the transformer can be reduced while keeping the inductivity of the loops and the inductive coupling coefficient high. With reduced length of the transformer the stray capacity decreases.

FIGS. 6A-6C show a first and a second primary winding 61, 62 with a substrate 63 inbetween of such a transformer in a side view (FIG. 6A), in a top view of the upper layer (FIG. 6B) and in a top view of the lower layer (FIG. 6C).

The first and second primary windings 61, 62 are connected by vertical through contacts or vias 61a.

A complete transformer with a primary side 60 with two primary windings (61, 62) and a corresponding secondary side 70 with two secondary windings and a spacer 71 between the primary and the secondary side is shown in FIG. 7.

A second embodiment of a transformer comprising through-plane loops is shown in FIG. 8. As an alternative to the in-plane loop design according to FIG. 5, a loop can be made by two leads on different metal layers and a through contact at the closed side of the loop. The loop plane then is perpendicular to the layer structure of the laminate.

According to FIG. 8, a first and a second stripline 80a, 80b, each comprising a first and a second metal layer 81, 82, are coupled by means of such a transformer 83 comprising a first loop 83a and a second loop 83b.

In the embodiment according to the schematic top view of FIG. 9A, the primary loop 91 and the secondary loop 92, each running at the top layer 81 and the bottom layer 82 of the stripline, each with multiple turns, are interleaved. This will provide a higher inductive coupling factor than two planar loops in the above in-plane embodiment (FIG. 5).

Alternatively, the primary and secondary loops 91, 92 may be arranged side by side to minimize the stray capacitance according to the schematic top view of FIG. 9B.

As another alternative, solenoid-based transformers comprising wire-loops which are for example mounted on the surface of the substrate can be used as well. However, in contrary to the PCB based approach above, this may create increased thickness of the transmission line, which is disadvantageous especially when used for catheters. Furthermore, in this case, the manufacturing of the line and the catheter tube are not independent from each other. The inductivity and coupling of the transformer depends on the content of the lumina (e.g. guidewire and/or water and/or $CO_2$).

II.) At second, several embodiments of striplines and their properties shall be described in more details.

With the technique according to the invention, a dedicated stripline can be designed to match the cross section that is available within the cross section of a catheter. Three electrical parameters should be adjusted in the design of the line: First, it should be optimized for low attenuation. Second, the effective dielectric constant $\in_{eff}$ for the common mode should be as low as possible in order to require as few transformers as possible to shift the common mode resonance beyond the Larmor frequency. Third, the characteristic impedance Z should be chosen such that matching to the transformer is possible with reasonable capacitances in a matching network.

As exemplary embodiments, three different types of striplines are indicated in cross sections in FIGS. 10A-10C and explained with respect to their electrical properties below.

FIG. 10A shows a first, parallel stripline with two metal layers M, each on one side of a dielectric substrate S. A second, triplate stripline according to FIG. 10B has two metal layers M, each on one side of a dielectric substrate S and a third metal strip Mi within the substrate S, whereas in a third, square coaxial stripline according to FIG. 10C the substrate S is surrounded on all four sides by a metal layer M and comprises a metal strip Mi within the substrate S. FIG. 10C as well shows the extension of the width W of these striplines.

However, there are many more strip transmission lines, even very complicated ones like the one depicted in FIG. 11 in cross section or as disclosed in Thiel, Habiger, Tröster: Investigations on Novel Coaxial Transmission Line Structures on MCM-L (Electronics Laboratory, ETH Zürich) which could be used as well.

The impedances for all three types according to FIGS. 10A-10C should be in a reasonable range of 20 Ohm to 80 Ohm so that matching with a capacitive network to the transformer is possible. Generally, the impedance of a parallel stripline is higher than that of the triplate stripline and the square coaxial stripline for the same overall thickness and width. The impedance for the square coaxial stripline is similar to those of the triplate stripline for the same outer dimensions.

FIG. 12 shows in plot A the impedance Z [Ohm] in dependence of the width B [µm] of a parallel stripline with a thickness of 254 µm and a PTFE substrate material, in plot B the impedance Z [Ohm] in dependence of the width B [µm] of a parallel stripline with a thickness of 127 µm and a PTFE substrate material, and in plot C the impedance Z [Ohm] in dependence of the width B [µm] of a triplate stripline with a thickness of two times of 127 µm (each between the outer metal layer M and the center metal strip Mi) and a PTFE substrate material.

Generally, the impedance Z of the parallel striplines is more adequate to be matched to the transformers.

The loss of a micro-stripline can be split up into ohmic losses, dielectric losses and radiation losses. For the intended miniaturized geometry and the range of dielectric materials in question, the loss is dominated by the ohmic losses in copper. Preferentially, the parallel striplines are used because they have the advantage of equally large leads over the other types like triplate or square coaxial striplines. In the latter the center lead with relatively low cross section adds much to the loss. As a result, parallel striplines have lower loss for the same outer dimensions of the line.

Figure 15:
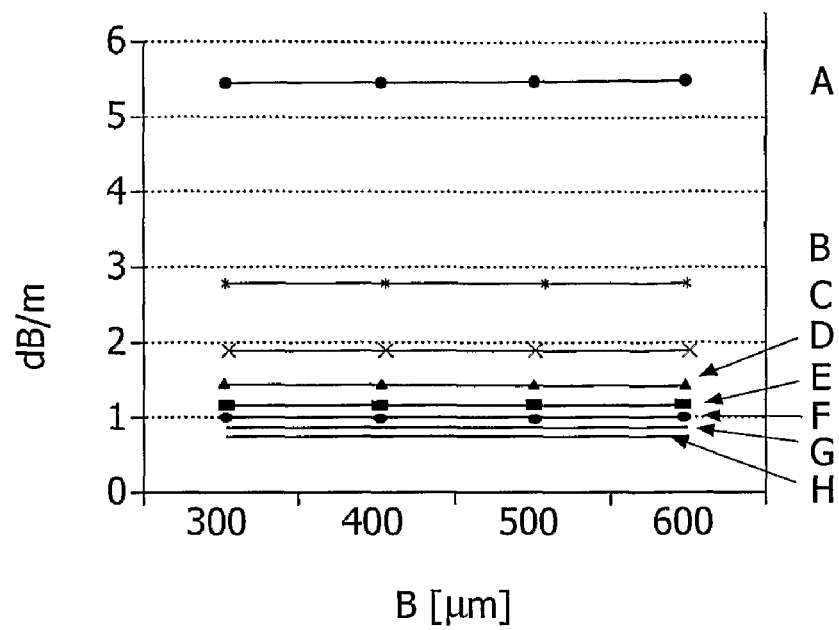

FIG. 15 shows the loss of parallel striplines with a polyamide substrate in dependence of their width B [µm] for a dielectric thickness of 200 µm (plot A), 175 µm (plot B), 150 µm (plot C), 125 µm (plot D), 100 µm (plot E), 75 µm (plot F), 50 µm (plot G) and 25 µm (plot H).

Figure 16:
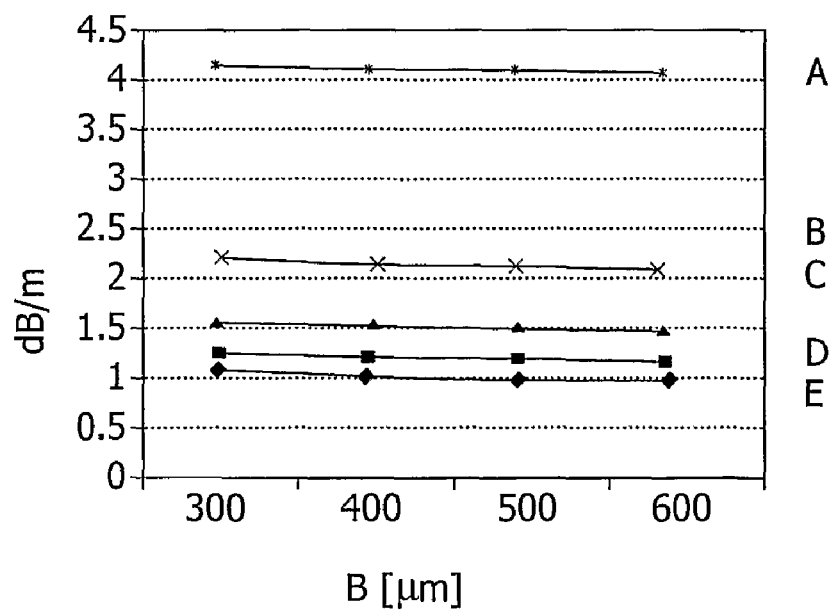

FIG. 16 shows the loss of triplate striplines with a polyamide substrate in dependence of their width B [µm] for a dielectric thickness of 267 µm (plot A), 217 µm (plot B), 167 µm (plot C), 117 µm (plot D) and 67 µm (plot E).

One more important property of a stripline is its shielding property against RF transmission. RF transmitted by a body coil during spin excitation of the imaging sequence may induce some voltage in unshielded lines.

Consequently, power may be dissipated especially at the transformers because of their relatively high quality factor and because they are made resonant for differential mode voltage. This may destroy the transformers or cause heating of the patient near the transformers.

Figure 1A:
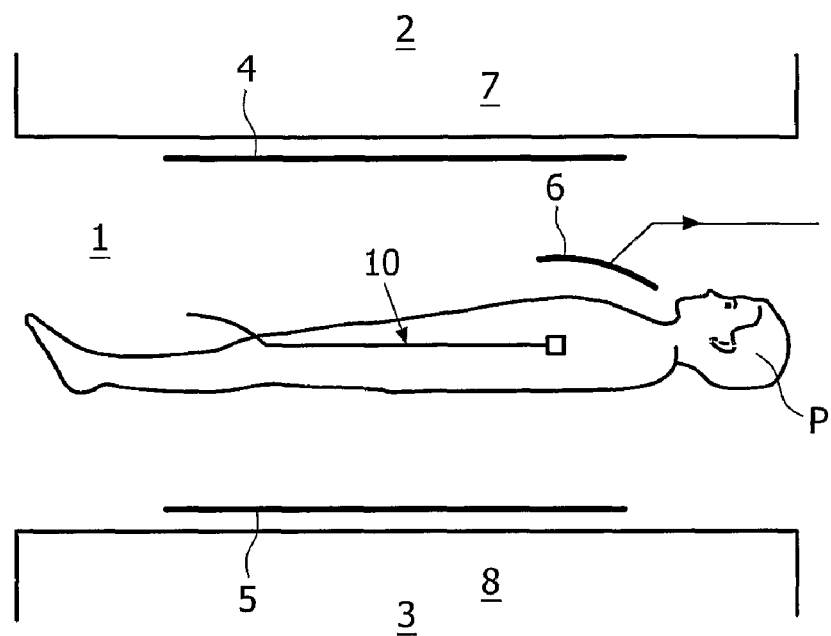
Figure 1B:
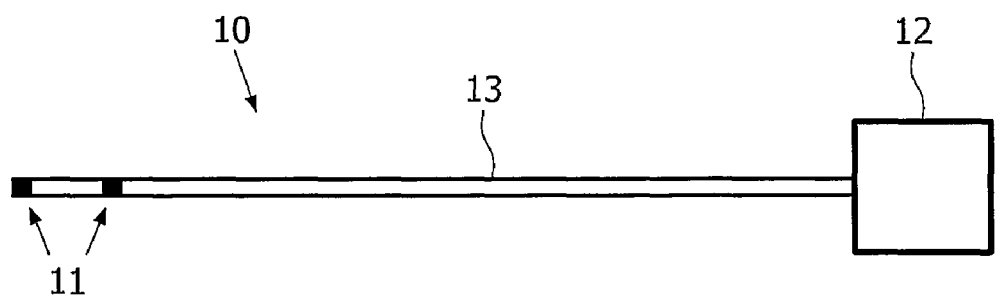
Figure 2A:
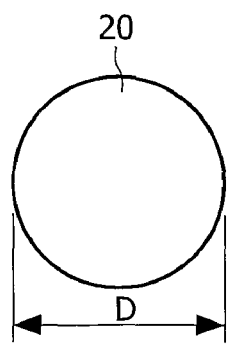
Figure 2B:
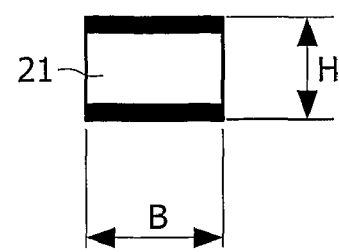
Figure 3A:
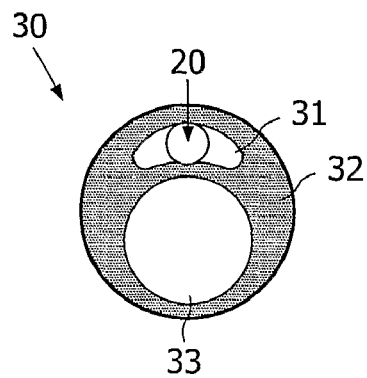
Figure 3B:
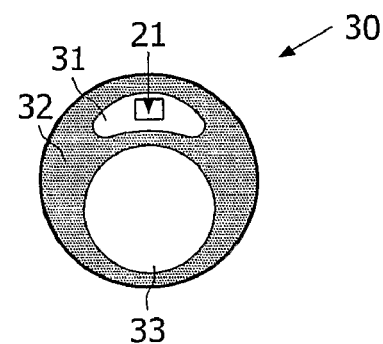
Figure 4A:
Figure 4B:
Figure 5:
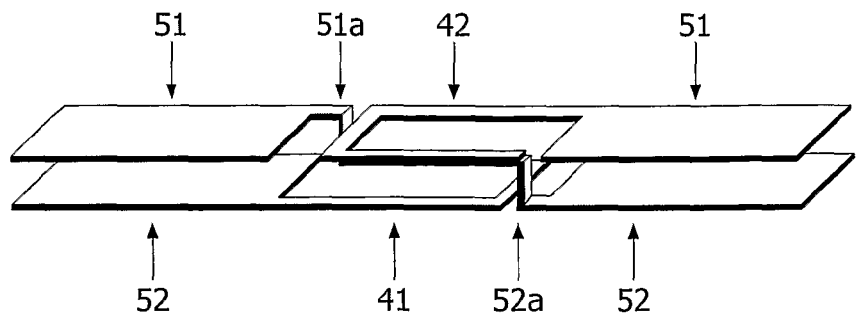
Figure 6A:
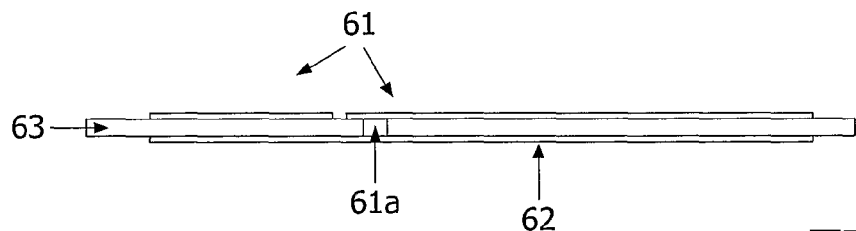
Figure 6B:
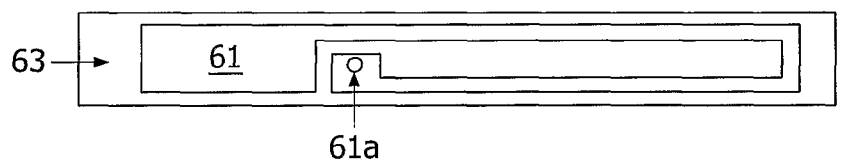
Figure 6C:
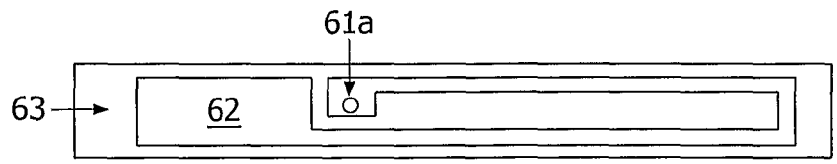
Figure 7:
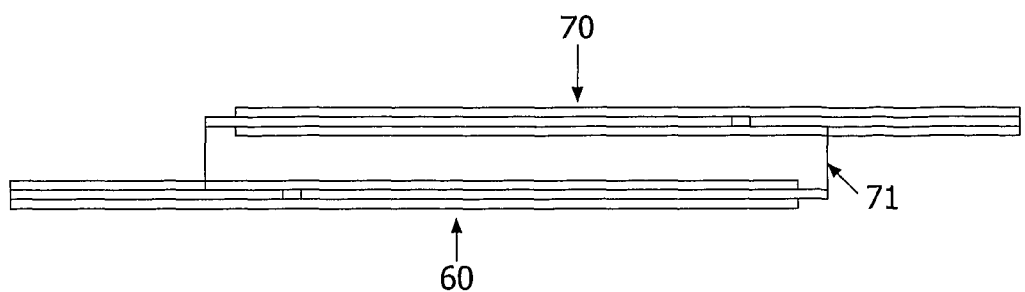
Figure 8:
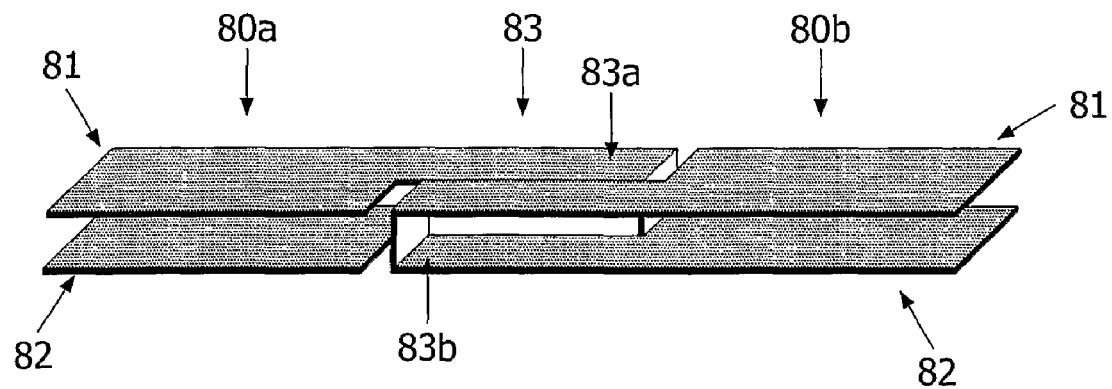
Figure 9A:
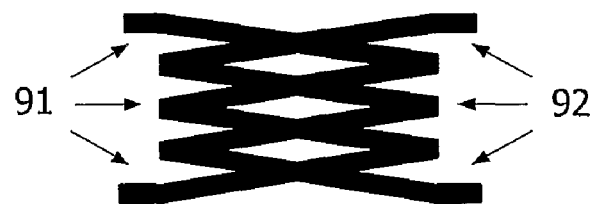
Figure 9B:
Figures 10A, 10B, 10C:
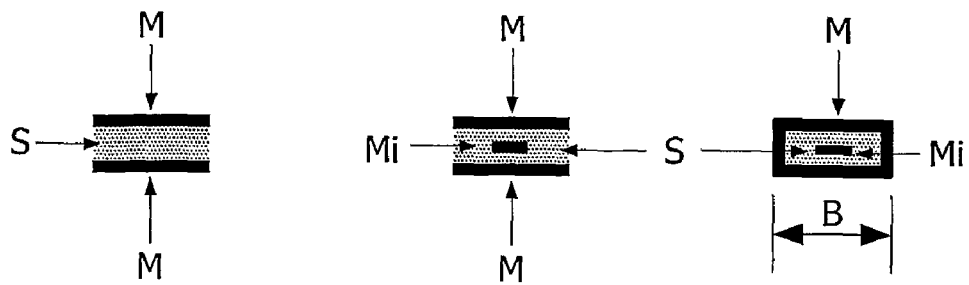
Figure 11:
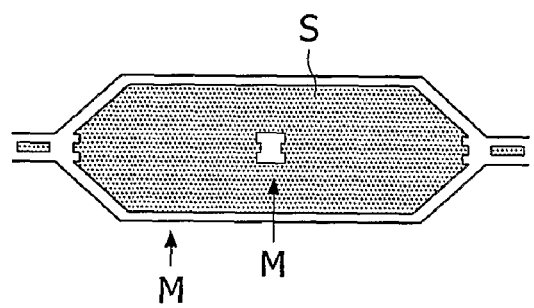
Figure 12:
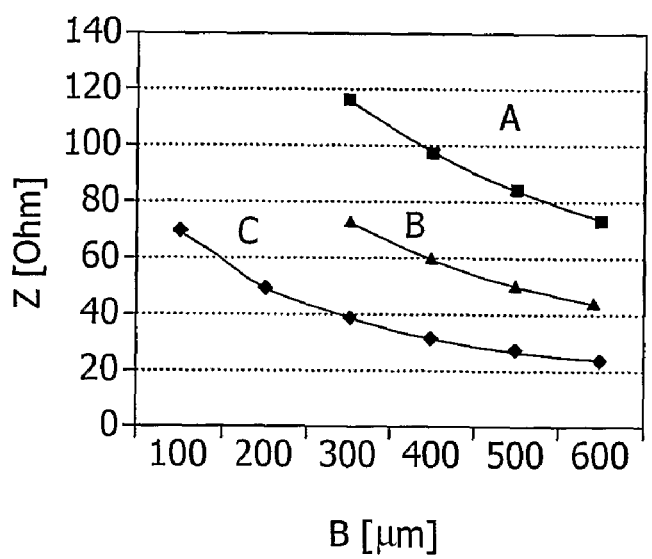
Figure 13:
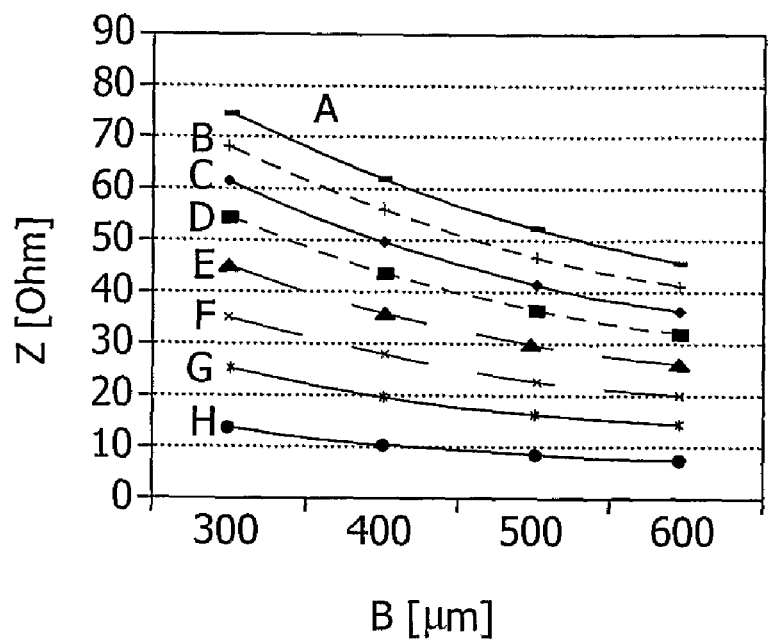
FIG. 13 shows the impedances Z [Ohm] in dependence of the width B [µm] of parallel striplines from Polyamide with a dielectric thickness of 200 µm (plot A), 175 µm (plot B), 150 µm (plot C), 125 µm (plot D), 100 µm (plot E), 75 µm (plot F), 50 µm (plot G) and 25 µm (plot H).
Figure 14:
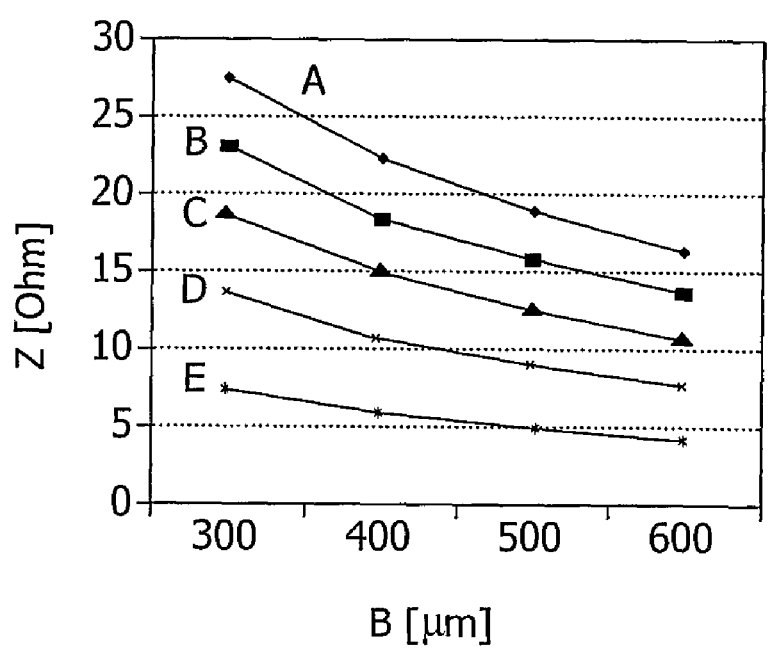
FIG. 14 shows the impedances Z [Ohm] in dependence of the width B [µm] of triplate striplines from Polyamide with a dielectric thickness of 267 µm (plot A), 217 µm (plot B), 167 µm (plot C), 117 µm (plot D) and 67 µm (plot E).

The square coaxial stripline according to FIG. 10C is completely shielded.

The triplate stripline according to FIG. 10B is quasi shielded against the RF transmitted by the body coil. Quasi shielding during transmission results from the symmetry of the triplate and the homogeneity of the RF transmit field of the body coil.

The parallel stripline according to FIG. 10A is completely unshielded. The transmit field strength $B_1$ of a body coil may induce some voltage in the loop spanned by the two strips of the line. According to the invention, this line and similar ones are shielded by twisting the lines in order to avoid induction of high net voltages. This is possible due to the homogeneity of the RF field of a body coil over the lateral dimensions of the lines.

Since the cross section of most striplines is not circular, ordinary twisting would increase the effective cross section. Also ordinary twisting may be difficult to realize during integration of the line in the catheter tube. Therefore, localized swaps of the leads of transmission lines are provided. Two examples for such a parallel stripline with metal layers (Cu) M on a foil F are shown in FIGS. 17A-17B and 18A-18B.

Figure 17A:
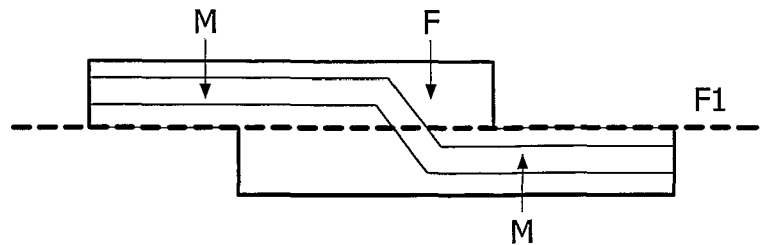
Figure 17B:

In the first example according to FIGS. 17A-17B, the swap is realized by including a lateral displacement in the PCB layout which is shown in FIG. 17A. Prior to insertion into a catheter tube the line is folded along the indicated folding line Fl and fixed by gluing. The resulting layout which is shown in FIG. 17B is very simple, however, it locally increases the cross section of the stripline.

Figure 18A:
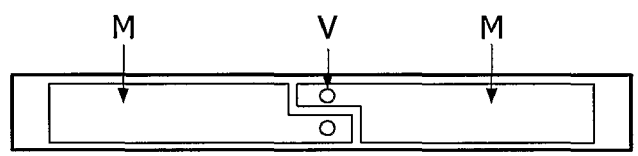
Figure 18B:
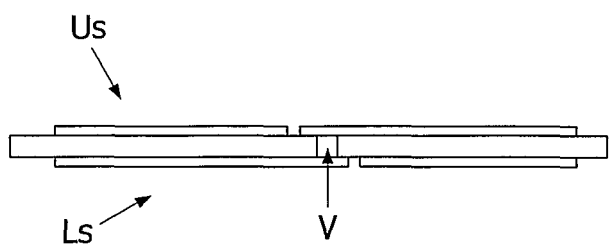

In the second example according to FIGS. 18A-18B through contacts (vias) V are used in the PCB design to swap the upper strip Us and the lower strip Ls of the line. The profile of the line remains constant across the swap. Since each swap causes losses, the number of swaps is kept as low as possible. It can be estimated, that for 1.5 T only maximally one twist is required in a line section between two transformers.

Figure 19:
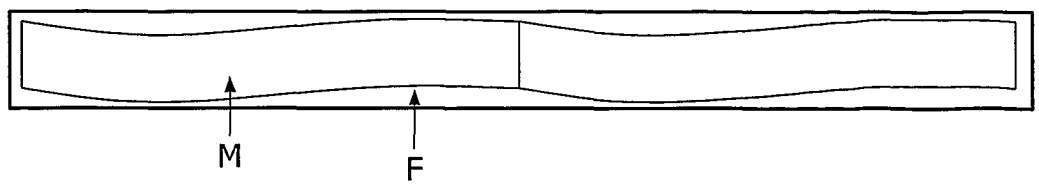

During assembly and during use the stripline is exposed to mechanical stress mainly along the line. The copper leads M are more prone to rupture than the polymeric dielectric F. Therefore, meander structures are preferably used for the copper leads M along the stripline according to FIG. 19.

III.) At third, several embodiments of matching networks and their properties shall be described in more details.

Figure 20:
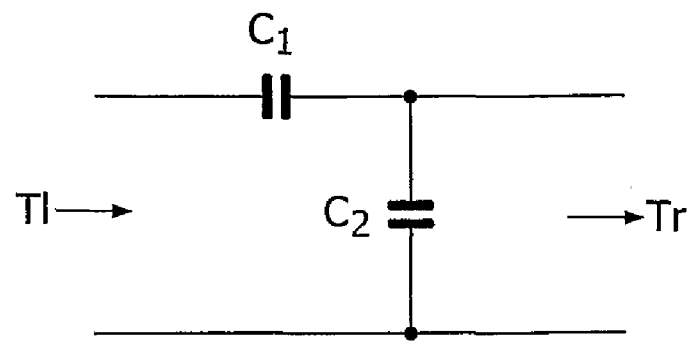

Matching networks are used to achieve impedance matching of the PCB based transformer to the PCB based striplines. The matching networks are passive networks and may comprise inductivities, capacitors and resistors. Preferably, capacitors are used rather than inductivities, because they can be realized on smaller scale. According to FIG. 20, a transformer Tr as e.g. described in the first embodiment above, can be matched to a transmission line Tl with an impedance of 50 Ohm by a network comprising two capacitors, wherein e.g. $C_1=61$ pF and $C_2=56$ pF.

Figure 21:
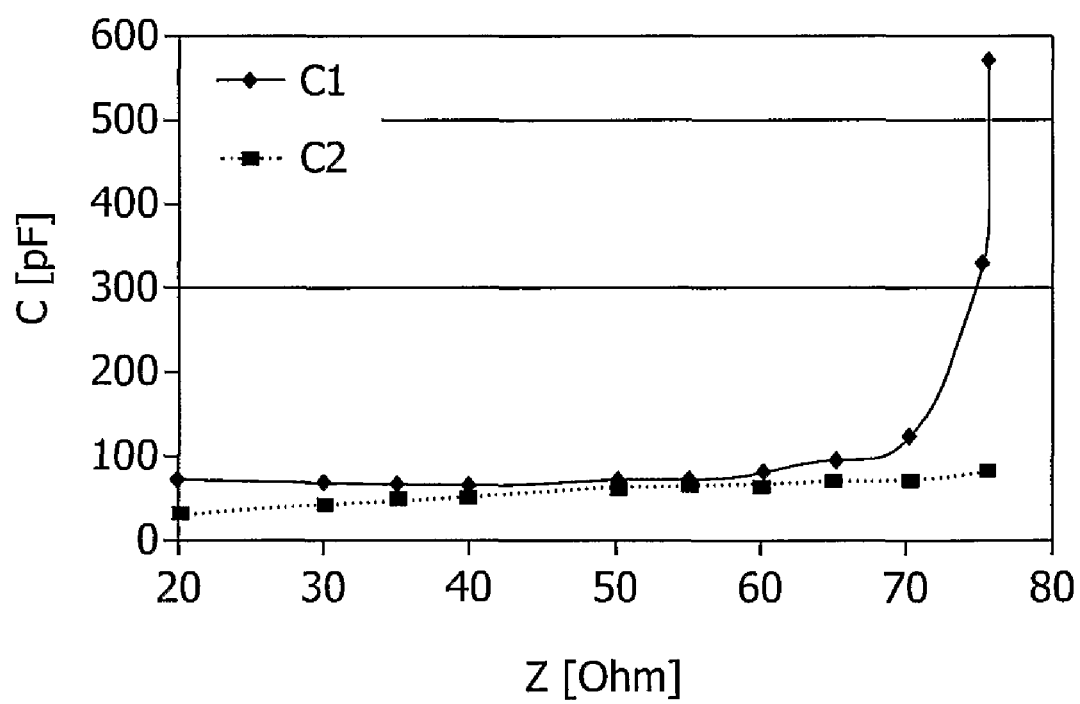

However, this simple network is capable of matching to striplines with impedances of 20 Ohm to 68 Ohm with capacitances equal to or smaller than 100 pF. Only for higher impedances larger capacitors are required. FIG. 21 shows the capacitances C [pF] of the capacitors $C_1$ and $C_2$ in dependence of the impedance Z [Ohm].

Preferably, discrete capacitors are used for the matching network because they can be added to the overall PCB design by standard SMD techniques. SMD capacitors in 0201 housing (0.6 mm×0.3 mm×0.3 mm) or in 01005 housing (0.4 mm×0.2 mm×0.2 mm) are available to achieve the required low profile. The capacitors can be either soldered in a relatively thick PCB board (300 µm) after drilling holes for them or preferably soldered onto a thin flex foil (25 µm-50 µm).

Figure 22A:
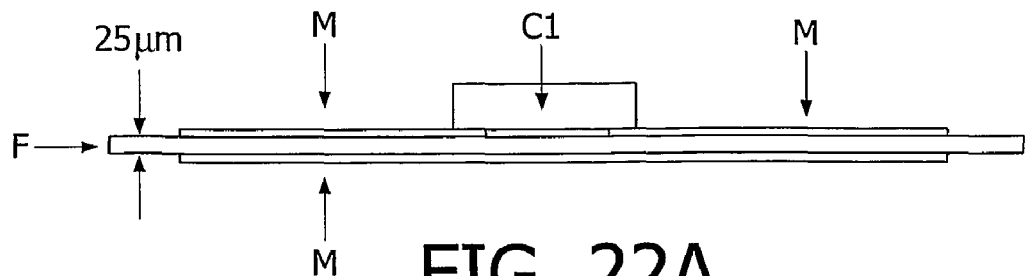
Figure 22B:
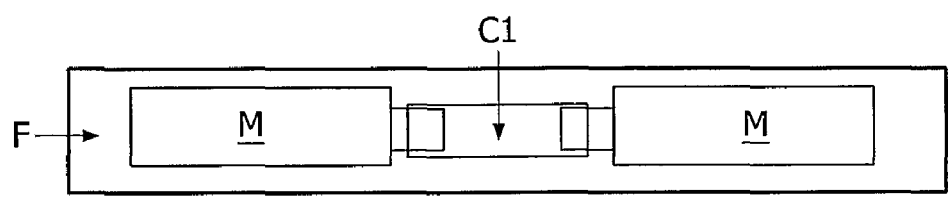
Figure 23A:
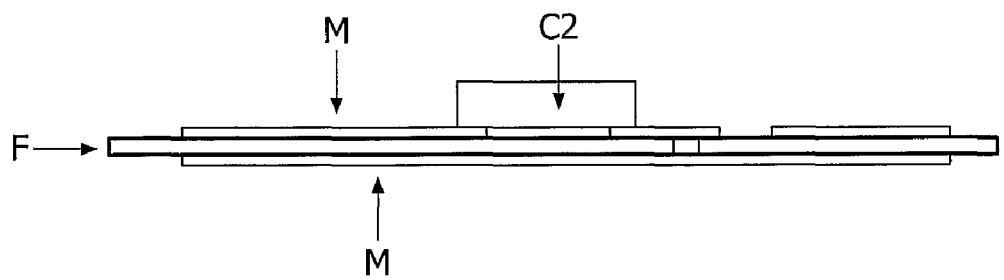
Figure 23B:
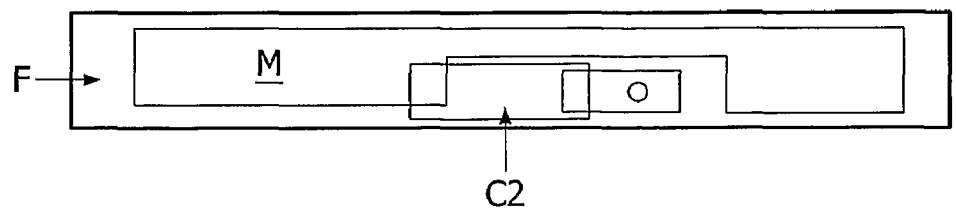

FIGS. 22A-22B show such an embodiment for the series capacitor $C_1$ in side view (FIG. 22A) and in top view (FIG. 22B), whereas FIGS. 23A-23B show such an embodiment for the parallel capacitor $C_2$ in side view (FIG. 23A) and in top view (FIG. 23B), both based on a 25 µm copper flex foil F with a metal layer M on both sides.

As an alternative, embedded capacitors based on the layers of the laminate can be used for the matching network as well:

Laminates may be used which have at least one layer made from a very thin (<15 µm) substrate with a relatively high dielectric constant $\in_r$. Parallel plate capacitors can then be structured based on this layer. Examples of appropriate materials are filled polymers like PTFE/ceramics ($\in_r=6-10$, RO3010, Rogers Corporation), other polymer/ceramics systems ($\in_r<150$), or newly developed ultra-high Er epoxy based polymers ($\in_r<2000$). Such materials are subject to intensive research and new developments are expected, since embedded capacitors are required for many PCB based solutions e.g. in wireless communication. Neglecting fringe effects the capacity can be estimated by $$C = \epsilon_r \epsilon_r A/d$$

Based on a 5 μm polymer/ceramics foil with $\epsilon_r=100$ capacitance densities of 180 pF/mm² are possible.

As a further alternative, embedded capacitors based on additional high Er dielectric materials can be used for the matching network as well:

Additional material with high dielectric constant and low loss can be added to the laminate by various thin film technologies as physical vapor deposition (sputtering), molecular beam epitaxy, chemical vapor deposition or other techniques. Examples are thin film capacitors from $Ta_2O_5$ ($\epsilon_r=25$) or $TiO_2$ ($\epsilon_r=100$).

IV.) In the following, the assembly of the line (a) and the integration of the components into the catheter (b) shall be explained in more details.

(a) Current PCB techniques are usually based on structuring boards of maximally 0.5 m×0.5 m size. Here, up to 2 m long and very narrow PCBs are required. To overcome the length limitation, the entire line can be manufactured in several modules which can preferentially either be glued together at the transformers or soldered at the transmission lines.

FIG. 24A shows such a first embodiment with basic modules Lm for gluing at the transformer, whereas FIG. 24B shows such a second embodiment with basic modules Ln for soldering at the line.

For series production preferably many of such modules are produced side by side on one 0.5 m×0.5 m board with a couple of millimeters distance in between. Then, the boards are connected at their boundaries, effectively producing many long transmission lines across three or four connected boards. Finally, the board is cut preferentially by a laser cutting process to yield many narrow and long transmission lines.

Soldering the modules at the transmission lines may have some disadvantages: an extra soldering step is required, transition losses may occur at the soldering points and the transitions may be mechanically weak.

Preferentially the transformers are glued by using a stacking tool as indicated in FIG. 26. This enables the required low tolerances for lateral displacements. The tool is similar to those used for the assembly of multilayer PCBs from many structured flex foils. The tool comprises of a solid base B with fine steel alignment pins P. The different structured flex foils have alignment holes H at corresponding points and several of those foils are stacked onto the tool and glued together.

The principle of stacking and gluing the transformer is indicated in FIGS. 25A-25B. FIG. 25A shows a top view of the lower loop of a transformer with the metal layer M, the foil F and the alignment holes H. FIG. 25B shows a side view of the transformer with the upper loop Ul, the lower loop Ll and a spacer S coated with glue G therebetween. Caps C for the capacitors are indicated as well.

Glueing the modules at the transformer has some other advantages: the gluing section is relatively long and therefore mechanically strong, one is free to select any spacer material and thickness independent from the layer structure of the laminate, and a low Fr material as PTFE or PP can be selected to keep the stray capacitance across the transformer low.

(b) The transmission line can be integrated into the catheter tube by extruding the line together with the catheter tube. However, for some types of laminates, the extrusion temperatures may be too high. Moreover, extrusion becomes a cheap process only for very long tubes. For the above embodiments, maximally 2 m long sections are required.

Therefore, it is preferred to insert the transmission line into the side lumen of a ready catheter tube. The simplest procedure is to first push a metal or plastic wire through the side lumen, to connect it to the transmission line and then to pull the latter through. To aid the insertion and to lower the mechanical stress on the line, the following measures are proposed:

The tube is stretched during insertion;

Preferably, tube materials with low friction properties as PTFE are used;

Over pressure is applied to the side lumen to inflate it slightly during insertion;

A higher pressure is applied at the entry opening of the side lumen than at the end point. Thus, some air stream flows as a lubricant and the transmission line is partially sucked into the side lumen; and Under-pressure is applied to the other lumina and the surrounding of the tube.

In a typical application, at the distal tip the transmission line may be connected to a micro receive coil either used for catheter tracking or for intravascular imaging. Consequently, such a distal micro receive coil has to be integrated as well:

Preferably, at least the matching network required to match this coil to the transmission line is included into the PCB design and two soldering pads for the coil are provided if it is wound from a wire.

Figure 27:
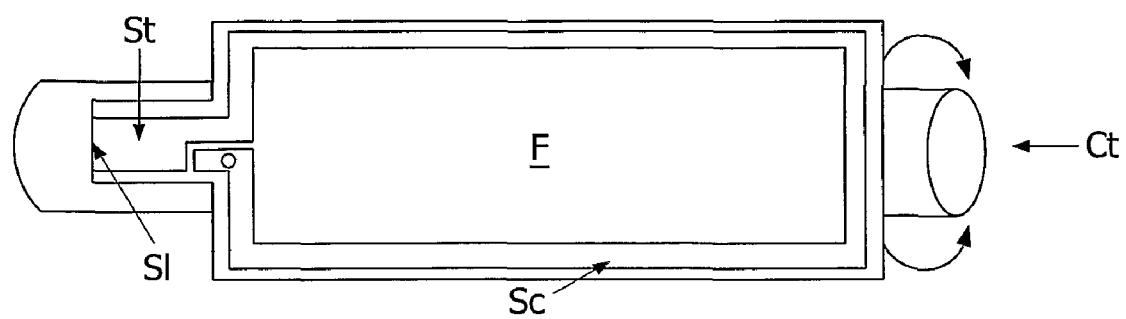

Alternatively, the micro coil can be structured on the flex foil as well. The most basic coil design is that of an elongated single loop Sc as shown in FIG. 27.

In order to realize a large coil—this is required for a high SNR as well as a long range spatial sensitivity—the coil is preferably extended beyond the side lumen of the catheter tube. Preferentially, the stripline St leaves the side lumen Sl short before the coil begins as indicated in FIG. 27. Since the coil is structured on a thin flex foil F, it can be wrapped around the outside of the catheter tube Ct such that the coil windings are finally located on opposite sides of the catheter tube Ct.

However, coils with multiple loops and much more complicated winding patterns can be designed as well.

The main advantages of the PCB based approach as disclosed above are as follows:

The transformer, the stripline and the matching network of the line are produced in one process using standard PCB techniques based on photolithography. Expensive manual assembly of these individual components is omitted;

Many transmission line modules can be produced side by side on standard size boards, are glued together across the transformers and cut into thin sections holding one line each. This makes the mass production cheap;

The entire cable can be produced at a very low profile and in a cross section that easily fits to the cross section of the side lumen of a catheter tube;

The mechanical properties are improved with respect to soldering assembly the individual components, where the soldering points would provide weak points;

The micro-stripline can be designed to have an impedance that allows easy matching to the transformer; and The micro-stripline can be designed to compromise between loss and profile.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An electrically conductive transmission line comprising:
a plurality of lead segments;
a plurality of transformers, each transformer coupling a pair of adjacent lead segments of the line and providing safety of the line when guided through a RF field, the lead segments and the transformers being provided in the form of at least one metallic structure on a substrate.

2. The transmission line according to claim 1, wherein the substrate is a single- or multi-layer laminate of metal and dielectric materials and wherein the lead segments are provided in the form of striplines on and/or within the substrate.

3. The transmission line according to claim 2, wherein the lead segments comprise parallel striplines which are shielded by twisting the lines so that induction of high net voltages are at least substantially avoided.

4. The transmission line according to claim 3, wherein the shielding is provided by localized swaps of the lead segments.

5. The transmission line according to claim 1, wherein the lead segments comprises a meander structure in their longitudinal extension for increasing mechanical strength of the line.

6. An electrically conductive transmission line comprising at least one transformer for coupling at least two lead segments of the line and for providing safety of the line when guided through a RF field, wherein
the lead segments and/or the transformer are provided in the form of at least one metallic structure on a substrate;
the transformer is realized in the form of at least one inductively coupling element; and
the inductively coupling element is realized by inductively coupling electrically conductive loops on different metal layers of the substrate.

7. The transmission line according to claim 1, wherein the inductively coupling element is realized by inductively coupling electrically conductive loops on different metal layers of the substrate.

8. The transmission line according to claim 7, wherein the inductively coupling loops are realized as in-plane loops and/or through-plane loops of the metal layers.

9. The transmission line according to claim 8, wherein the inductively coupling through-plane loops are interleaved with each other or arranged side by side.

10. The transmission line according to claim 6, comprising at least one matching network with at least one inductivity and/or capacitor and/or resistor provided on the substrate for matching a lead segment to a transformer.

11. The transmission line according to claim 10, wherein the matching network comprises elements which are embedded into the layer structure of the substrate.

12. An electrical accessory device or auxiliary equipment comprising:
a catheter, comprising; and
a transmission line according to claim 1 extending from the catheter to a connection unit in a magnetic resonance imaging system.

13. A magnetic resonance imaging system comprising at least one electrical accessory device or auxiliary equipment according to claim 12.

14. The transmission line according to claim 6, wherein the substrate is air.

15. An electrically conductive transmission line for use in RF fields, the transmission line comprising:
an elongated, electrically insulating substrate strip;
a plurality of electrically conductive segments supported on the substrate strip, the electrically conductive segments being separated from each other along the substrate strip; and
a plurality of transformers, each transformer individually coupling a pair of adjacent segments.

16. The transmission line according to claim 15, wherein the segments integrally define at least one loop at each end, the integral loops of adjacent segments being disposed to inductively couple with each other to define one of the transformers.

17. The transformer line according to claim 15, wherein each segment includes at least one foil layer.

18. The transmission line according to claim 15, wherein the transformer is realized by inductively coupling electrically conductive loops on different metal layers of the substrate.

19. The transmission line according to claim 15, wherein the transmission line extends from a device through RF fields of a magnetic resonance imaging system and connects to a connection unit configured with a power supply, transmit/receive device, control device, and/or switching unit.

20. The transmission line according to claim 19, wherein the device includes a catheter.

* * * * *